(12) United States Patent
Franken et al.

(10) Patent No.: US 10,937,625 B2
(45) Date of Patent: Mar. 2, 2021

(54) METHOD OF IMAGING A SAMPLE USING AN ELECTRON MICROSCOPE

(71) Applicant: FEI Company, Hillsboro, OR (US)

(72) Inventors: Erik Michiel Franken, Eindhoven (NL); Remco Schoenmakers, Eindhoven (NL); Bart Jozef Janssen, Eindhoven (NL); Martin Verheijen, Eindhoven (NL); Holger Kohr, Eindhoven (NL); Yuchen Deng, Eindhoven (NL); Andreas Voigt, Eindhoven (NL)

(73) Assignee: FEI Company, Hillsboro, OR (US)

( * ) Notice: Subject to any disclaimer, the term of this patent is extended or adjusted under 35 U.S.C. 154(b) by 0 days.

(21) Appl. No.: 16/690,684

(22) Filed: Nov. 21, 2019

(65) Prior Publication Data

US 2020/0168433 A1 May 28, 2020

(30) Foreign Application Priority Data

Nov. 26, 2018 (EP) .................................... 18208355

(51) Int. Cl.
  *H01J 37/20* (2006.01)
  *H01J 37/22* (2006.01)
  *H01J 37/26* (2006.01)

(52) U.S. Cl.
  CPC ............ *H01J 37/20* (2013.01); *H01J 37/222* (2013.01); *H01J 37/26* (2013.01); *H01J 2237/20207* (2013.01)

(58) Field of Classification Search
  CPC .......... H01J 37/20; H01J 37/222; H01J 37/26; H01J 2237/20207
  See application file for complete search history.

(56) References Cited

U.S. PATENT DOCUMENTS

| | | |
|---|---|---|
| 2011/0284744 A1 | 11/2011 | Zewail et al. |
| 2013/0234024 A1 | 9/2013 | Kubo et al. |
| 2015/0069231 A1 | 3/2015 | Luecken et al. |
| 2016/0118219 A1 | 4/2016 | Potocek et al. |

OTHER PUBLICATIONS

Anonymous, Technical note: "Functional description of Tecnai™ Tomography Software", version Dec. 31, 2003, pp. 1-20, FEI Company.
Arslan, I., et al, Reducing the Missing Wedge; High-resolution Dual Axis Tomography of Inorganic Materials, Ultramicroscopy, Oct. 1, 2006, pp. 994-1000, vol. 106, No. 11-12, Elsevier, Amsterdam, NL.
Anonymous, Stroboscopic Continuous Tilt Tomography in a Transmission Electron Microscope, Research Disclosure, Oct. 1, 2017, p. 781, Kenneth Mason Publications, Hampshire, UK, GB.

*Primary Examiner* — Nicole M Ippolito
*Assistant Examiner* — Hanway Chang

(57) ABSTRACT

The invention relates to a method of imaging a sample, said sample mounted on a sample holder in an electron microscope, the electron microscope comprising an electron source for generating a beam of energetic electrons along an optical axis and optical elements for focusing and deflecting the beam so as to irradiate the sample with a beam of electrons. The sample holder is capable of positioning and tilting the sample with respect to the electron beam. The method comprises the step of acquiring a tilt series of images by irradiating the sample with the beam of electrons, and concurrently changing a position of the sample during acquisition of the images, so that each image is acquired at an associated unique tilt angle and an associated unique position.

19 Claims, 6 Drawing Sheets

METHOD OF IMAGING A SAMPLE USING AN ELECTRON MICROSCOPE

FIELD OF THE INVENTION

The invention relates to a method of imaging a sample using an electron microscope.

BACKGROUND OF THE INVENTION

An example of such a method is known from "Technical note: Functional description of Tecnai™ Tomography Software" FEI Company, version 31 Dec. 2003.

In an electron microscope, such as a Transmission Electron Microscope (TEM) an electron source produces a beam of energetic electrons with a selectable energy of, for example, between 80-300 keV, although higher and lower energies are known to be used. This beam is manipulated (focused, deflected) by optical elements (electron lenses, deflectors, multipoles) and irradiates a sample placed in a sample holder. The sample holder positions the sample, the holder typically showing three translational degrees of freedom (x, y, z) and one rotational degree of freedom ($\alpha$) or more rotational degrees of freedom. The sample is sufficiently thin to be transparent to electrons: some electrons are absorbed, but many electrons pass the sample while being scattered or unscattered. Typically the thickness of the sample is between 50 nm and 1 µm for biological samples (50-200 nm for cryogenic samples), and less than 100 nm for semiconductor samples. Another set of optical elements form an enlarged image of the sample on a detector, such as a CMOS camera, a CCD camera, a fluorescent screen, or a combination of fluorescent screen and camera connected via fiber optics.

As described in the Technical Note, the image formed on the detector is a 2D projection of the sample. To achieve a 3D image, a series of images of the sample under different rotational orientations is acquired in a so-called tilt-series. Typically the tilt series covers a tilt range from −70 to +70 degrees with regular intervals of 1 or 2 degrees. The images of the tilt series are then aligned with respect to each other, and a 3D reconstruction is made using appropriate software, after which visualization may take place.

For each of the images of the tilt series the sample must be oriented to another tilt angle. Due to the high resolution of a TEM, the sample should be stabilized to within, for example, 1 nm or less. Therefore typically a relaxation time of 1 second or more is used to damp drift of the stage. As a result of this the acquisition of a tilt series is a time consuming process.

In U.S. Pat. No. 9,147,551 B2, in name of the present applicant, a method of acquiring the tilt series is described, wherein the sample holder is changing the tilt angle continuously while acquiring the tilt series and the position of the sample is changed continuously to keep the sample on the optical axis. This so called "tomo-on-the-fly", which was made possible by developments in faster acquisition time and smooth tilting mechanism, decreased the time needed for obtaining the tilt series.

There is a desire to further improve the method for acquiring the tilt series. It is in particular of interest to increase the resolution of the obtained images, and/or to increase the speed with which the tilt series can be obtained.

SUMMARY

A method of imaging a sample is provided. According to the method, a sample holder is used that is capable of orienting and tilting the sample with respect to the electron beam. The method comprises the step of acquiring a tilt series of images by irradiating the sample with the beam of electrons, the images recorded on a camera with a read-out speed, wherein the tilt angle is changed continuously while acquiring the tilt series of images.

According to a first aspect, the method further comprises the concurrent step of changing a position of the sample whilst acquiring the tilt series. In particular, said position is changed continuously while acquiring the tilt series of images. This means that the position of the sample is changed simultaneously with changing the tilt angle. The result is that each image is acquired at an associated unique tilt angle and an associated unique position.

It is noted that in the method as described in U.S. Pat. No. 9,147,551 B2, as referenced above, a position of the sample is changed continuously to keep the sample on the optical axis. Thus, in fact, there is no actual concurrent change in the position of the sample, as it is the express intention of the described method to maintain a fixed position during acquisition of the tilt series. Thus, this prior art method results in that each image is acquired at an associated unique tilt angle and a single, fixed position. According to the above aspect of the invention, however, the position is changed continuously during continuous tilting of the sample to provide a set of unique tilt angles and corresponding set of unique positions. Thus, the position of the sample is changed, leading to additional sample information in the acquired set of images. With this, the object of the invention is achieved.

It is noted that changing the position may comprise the step of increasing the imaged portion of the sample, in particular during the acquisition of the tilt series. This way, a larger portion of the sample is imaged, whilst retaining the desired imaging resolution. It is conceivable in this respect that the position is changed by means of a relative movement between the sample and the electron beam. For example, the sample may be moved with respect to the optical axis. For example, the position of the sample may be continuously changed by mechanically moving the sample with respect to the electron beam. In another embodiment, the electron beam is moved with respect to the sample.

In this respect, it is also noted that it is known to perform a first tilt series, subsequently move the sample to a new position, and then perform a second tilt series at this new position. The new position is chosen in such a way that some overlap is present with the previous position, such that resulting images for the different tilt series have some overlap and can be stitched together into one or more final images. According to this known method the movement of the sample is not concurrent with the acquisition of the tilt series. Rather, the movement of the sample is an intermediate step in between the first and the second tilt series.

According to the method as disclosed herein, the changing of the position is synchronous with the changing of the tilt angle. Thus, no time is lost for moving and stabilizing the position of the sample holder to a new position. Additionally, the camera is acquiring images continuously, making the method as disclosed herein also suitable for rapidly changing samples. A further advantage is that all electrons that are used to irradiate the sample and impinging on the camera are used in imaging, and thus no useless sample deterioration occurs. In this respect, it is known that especially biological samples deteriorate due to radiation damage resulting from electron irradiation.

According to another aspect, a method is defined according to claim 5. According to this aspect, the method comprises the step of concurrently changing a further tilt angle of the sample whilst acquiring the tilt series so that each image is acquired at an associated unique tilt angle and an associated unique further tilt angle. Said further tilt angle may be orthogonal with respect to said tilt angle. Using this method yields more information about the sample during a single tilt series, as it reduces the so called missing wedge. With this, the object of the invention is achieved.

Thus, from the above it follows that continuously changing the tilt angle and the position, or further tilt angle, respectively, of the sample whilst acquiring the tilt series of images of the sample leads to a faster acquisition time and/or more information about the sample. Thus, an improved method for imaging a sample is obtained. With this, the object of the invention is achieved.

Further advantageous embodiments will be discussed below.

In an embodiment, the sample is imaged on a pixelated camera, and a velocity of the tilt angle, expressed in degrees per second, a velocity of the concurrent change in position or further tilt angle, expressed in meters per second or degrees per second, respectively, and the read-out speed of the camera, expressed in frames per second, are matched so that a displacement of the image due to a tilt change during one frame is for example less than one pixel, and preferably less than ½ a pixel. By so matching the tilt speed and the read-out speed, the resolution of the camera is optimally used. Known camera's for these purposes comprise, for example, 4096*4096 pixels. The read-out speed of the camera can be limited by the possibilities of the camera, or by the need for a sufficient number of electrons in one image. It is noted that it is possible to integrate many images, each with a low number of electrons, but compared to one image with a longer illumination time and an identical number of detected electrons as available in the integrated set of images this results in a lower signal-to-noise ratio. Therefore the acquisition of one image with a longer frame time is preferred over the integration of several images with a lower frame time. This may thus lead to the choice of a read-out speed of the camera and the tilt speed of the sample holder, in which each frame comprises sufficient electrons, both for the number of electrons needed for the image, for example for forming a 3D reconstruction (a tomogram) and for acquiring the data needed for shifting the images with respect to each other (using, for example, correlation techniques). In practice, however, the read-out speed of the camera is the limiting factor. Therefore, the highest possible frame rate is selected, and dose rate and tilt speed are adapted to said read-out speed/frame rate.

In an embodiment, use is made of stroboscopic illumination of the sample. The sample is illuminated in a stroboscopic manner, and the frequency of the illumination pulses may be synchronized with the camera frame read-out. Preferably, a single pulse is provided at the beginning of the readout of each frame. The duration of the pulse specifies the amount of motion blur that remains, and preferably the duration is chosen as small as technically possible. Due to stroboscopic illumination, it is possible to acquire high quality tilt series with arbitrarily many angles at high speed, whilst reducing the "smearing" effect caused by motion blur of the images due to the tilt increment and/or repositioning during the exposure time of a single acquired image.

In an embodiment, the velocity of the tilt is modulated. The rotation of the sample results in a change of the image. This change is a function of the tilt angle: $\Delta = d \cdot \sin \alpha$, with $\Delta$ the displacement of an image point due to the rotation, d the distance of the point of the sample with respect to the tilt axis and a the tilt axis. For an identical displacement between images, at small tilt angles (sample perpendicular to the optical axis), the tilt speed can thus be larger than for high tilt angles.

In an embodiment, a shift and/or rotational correction to the images forming the tilt series is applied relative to each other. The images forming the tilt series should be arranged shifted and rotated such that one point on the tilt axis is taken as reference for all images. This may include a pair-wise correction. However, if the images comprise too little information per image for the algorithm used, an algorithm using two or more sets of images may be used, where, for example, the shift and/or rotational correction is based on the information of two sets comprising two images each. It is furthermore conceivable that the sample comprises markers and these markers are used for the shift and/or rotational correction. By using markers, such as gold markers with a diameter of, for example, 10 to 20 nm, the position and orientation of each of the images is more easily found. Preferable more than one marker is used to enable not only shift correction, but also rotational correction of the images forming the tilt series. Also the tilt angle may be derived from the relative position of a set of markers.

According to an aspect, an electron microscope for imaging a sample is provided, wherein said electron microscope comprises:
an electron source configured to produce a beam of electrons along an optical axis of the electron microscope;
a sample holder;
a camera system for acquiring images; and
a programmable controller configured to control the sample holder and the camera system, wherein the programmable controller is programmed to control the sample holder and the camera system such that the camera can acquire a tilt series of images of a sample on the sample holder while the sample holder is tilted continuously and the sample position is concurrently changed while acquiring the tilt series so that each image is acquired at an associated unique tilt angle and an associated unique position. In an embodiment, the sample holder is capable of tilting the sample and concurrently moving the sample with respect to the electron beam. This allows the position of the sample to be changed during tilting of the sample. And in particular, this allows the imaged portion of the sample to be increased during tilting of the sample.

According to a further aspect, an electron microscope for imaging a sample is provided, wherein said electron microscope comprises:
an electron source configured to produce a beam of electrons along an optical axis of the electron microscope;
a sample holder;
a camera system for acquiring images; and
a programmable controller configured to control the sample holder and the camera system, wherein the programmable controller is programmed to control the sample holder and the camera system such that the camera can acquire a tilt series of images of a sample on the sample holder while the sample holder is tilted continuously about a first tilt axis as well as continuously about a second tilt axis, such that each image is acquired at an associated unique tilt angle and an associated unique further tilt angle. This allows the sample to be tilted about two distinct tilt axes: a first axis and a second axis. These two axes may be orthogonal with respect to each other. These two axes may define a plane that is substantially parallel to a plane defined by the sample. The controller may be arranged to change the first tilt angle at a different speed, compared to the change of the second tilt angle. It is also possible to assign a mutually different amplitude.

It is noted that the electron microscopes according to the two aspects as described above, can be combined. In other words, the programmable controller may be configured to tilt the sample about a first axis, whilst concurrently changing a further tilt angle and concurrently changing a position of the sample with respect to the electron beam.

In all embodiments of the electron microscope, it is conceivable that the electron microscope is programmed with software, and the software enables the electron microscope to perform the method of imaging a sample as described herein.

BRIEF DESCRIPTION OF THE DRAWINGS

Embodiments of the method and the electron microscope as disclosed herein will next be explained with reference to the accompanying figures, in which.

DETAILED DESCRIPTION OF EMBODIMENTS

Figure 1:
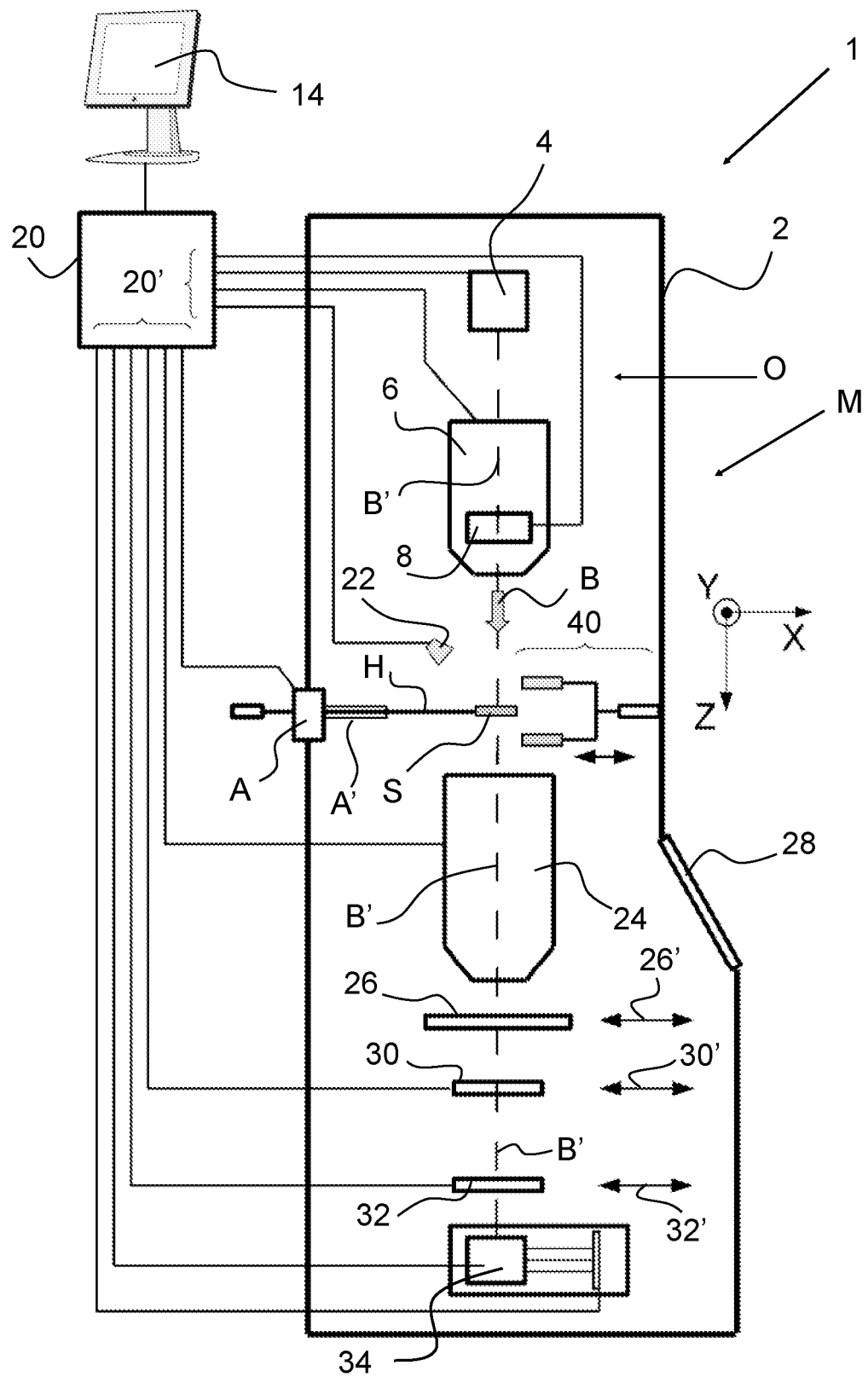
FIG. 1—schematically depicts a transmission electron microscope.

FIG. 1 (not to scale) is a highly schematic depiction of an embodiment of a charged-particle microscope M according to an embodiment of the invention. More specifically, it shows an embodiment of a transmission-type microscope M, which, in this case, is a TEM/STEM. It is noted that, in the context of the current invention, it could just as validly be a SEM, or an ion-based microscope, for example.

In FIG. 1, within a vacuum enclosure 2, an electron source 4 produces a beam B of electrons that propagates along an electron-optical axis B' and traverses an electron-optical illuminator 6, serving to direct/focus the electrons onto a chosen part of a specimen S (which may, for example, be (locally) thinned/planarized). Also depicted is a deflector 8, which can be used to effect scanning motion of the beam B.

The specimen S is held on a specimen holder H that can be positioned in multiple degrees of freedom by a positioning device/stage A, which moves a cradle A' onto which holder H is connected. The specimen holder H may comprise a finger that can be moved in the XY plane (see Cartesian coordinate system in FIG. 1), and typically, motion parallel to Z and tilt about X and/or Y will also be possible. Such movement allows different parts of the specimen S to be illuminated, imaged and/or inspected by the electron beam B traveling along axis B' (in the Z direction). Movement also allows a scanning motion to be performed, as an alternative to beam scanning. If desired, an optional cooling device (not depicted) can be brought into intimate thermal contact with the specimen holder H, so as to maintain it (and the specimen S thereupon) at cryogenic temperatures, for example.

The electron beam B will interact with the specimen S in such a manner as to cause various types of "stimulated" radiation to emanate from the specimen S, including (for example) secondary electrons, backscattered electrons, X-rays and optical radiation (cathodoluminescence). The electrons that traverse the specimen S and continue to propagate along axis B' can be studied. Such a transmitted electron flux enters an imaging system 24, which will generally comprise a variety of electrostatic/magnetic lenses, deflectors, and/or correctors. In normal (non-scanning) TEM mode, this imaging system 24 can focus the transmitted electron flux onto a fluorescent screen 26, which, if desired, can be retracted/withdrawn (as schematically indicated by arrows 26') so as to get it out of the way of axis B'. An image (or diffractogram) of (part of) the specimen S will be formed by imaging system 24 on screen 26, and this may be viewed through viewing port 28 located in a suitable part of a wall of enclosure 2. The retraction mechanism for screen 26 may, for example, be mechanical and/or electrical in nature, and is not depicted here.

As an alternative to viewing an image on screen 26, one can instead make use of the fact that the depth of focus of the electron flux leaving imaging system 24 is generally quite large (e.g. of the order of 1 meter). Consequently, various other types of analysis apparatus can be used downstream of screen 26, such as:

TEM camera 30. At camera 30, the electron flux can form a static image (or diffractogram) that can be processed by controller/processor 20 and displayed on a display device 14, such as a flat panel display, for example. When not required, camera 30 can be retracted/withdrawn (as schematically indicated by arrows 30') so as to get it out of the way of axis B';

STEM detector 32. An output from detector 32 can be recorded as a function of (X,Y) scanning position of the beam B on the specimen S, and an image can be constructed that is a "map" of output from detector 32 as a function of X,Y. Detector 32 can comprise a single pixel with a diameter of e.g. 20 mm, as opposed to the matrix of pixels characteristically present in camera 30. Moreover, detector 32 will generally have a much higher acquisition rate (e.g. $10^6$ points per second) than camera 30 (e.g. $10^2$ images per second). Once again, when not required, detector 32 can be retracted/withdrawn (as schematically indicated by arrows 32') so as to get it out of the way of axis B'.

As an alternative to imaging using cameras/detectors 30 or 32, one can also invoke spectroscopic apparatus 34, which could be an EELS module, for example.

It should be noted that the order/location of items 30, 32 and 34 is not strict, and many possible variations are conceivable. For example, spectroscopic apparatus 34 can also be integrated into the imaging system 24.

In the embodiment shown, the microscope M further comprises a retractable Computed Tomography (CT) module, generally indicated by reference 40. In Computed Tomography (also referred to as tomographic imaging) the source and (diametrically opposed) detector are used to look through the specimen along different lines of sight, so as to acquire penetrative observations of the specimen from a variety of perspectives. CT can be done by acquiring a tilt series (detecting the (S)TEM image and/or x-ray map at each tilt). X-rays may be detected with detectors 22 and/or 40, the difference is that detector 40 collects a larger solid angle and is therefore faster.

Note that the controller (computer processor) 20 is connected to various illustrated components via control lines (buses) 20'. This controller 20 can provide a variety of functions, such as synchronizing actions, providing setpoints, processing signals, performing calculations, and displaying messages/information on a display device (14). Needless to say, the (schematically depicted) controller 20 may be (partially) inside or outside the enclosure 2, and may have a unitary or composite structure, as desired.

It is noted that the electron microscope depicted in FIG. 1 comprises many components, many of which are described for clarification purposes only. In view of the present disclosure, the electron microscope 1 as shown in FIG. 1 is equipped for imaging a sample, for example using electron tomography, and comprises:

- an electron source 4 configured to produce a beam B of electrons along an optical axis B' of the electron microscope 1;
- a sample holder H;
- a camera system 30 for acquiring images; and
- a programmable controller 20 configured to control the sample holder H and the camera system, wherein the programmable controller 20 is programmed to control the sample holder H and the camera system 30 such that the camera can acquire a tilt series of images of a sample S on the sample holder H while the sample holder H is tilted continuously and the sample position is concurrently changed while acquiring the tilt series so that each image is acquired at an associated unique tilt angle and an associated unique position. As an alternative to changing the position, a further tilt angle may be concurrently changed while acquiring the tilt series so that each image is acquired at an associated unique tilt angle and an associated unique further tilt angle. In a further embodiment, the position and the further tilt angle are concurrently changed, to obtain a tilt series so that each image is acquired at an associated unique tilt angle, an associated unique further tilt angle, and an associated unique position.

In an embodiment, the electron microscope is a transmission electron microscope, and TEM camera 30 is used as the camera system. However, in other embodiments, it is conceivable that STEM detector 32 is used as the camera system instead.

Thus, FIG. 1 schematically shows a TEM 1. A particle source 4 produces a beam of electrons along optical axis B'. The electrons have a selectable energy of typically between 80-300 keV, although higher energies, e.g. 400 keV-1 MeV, or lower energies, e.g. 50 keV, may be used. The beam of electrons is manipulated by condenser system 6 to form a parallel beam impinging on a sample S, the sample positioned with a sample holder H. The sample holder H can position the sample S with respect to the optical axis B' and may shift the sample in the plane perpendicular to the optical axis B' (i.e. XY-plane) and tilt the sample with respect to at least one tilt axis perpendicular to the optical axis B' (ie. X and/or Y). Imaging system 24 is arranged to form a magnified image of the sample on a pixelated detector 32, thereby revealing sample details of e.g. 0.1 nm. The detector 32 may take the form of, for example, a CCD or CMOS camera.

Sample holder H and camera system 32 are controlled by a controller 20, and the controller may be equipped to convert the tilt series to a 3D tomogram and to visualize the tomogram on a screen 14. It is noted that for visualization specialized software is used, such as described in earlier mentioned technical note: "Functional description of Tecnai™ Tomography Software".

The controller 126 is programmed to store in a memory the image acquired via camera system 124 while controlling the sample holder 110 to tilt with a controlled tilt velocity round tilt axis 114, and at the same time controlling the electron microscope to change an orientation of the sample S. The sample stage is able to tilt the sample over a large angle (typically −80 to +80 degrees) in order to get sufficient data to reconstruct a 3D image of the sample. In an embodiment, the sample stage H is able to change the orientation of the sample by tilting the sample about a further tilt axis that is in particular perpendicular to the aforementioned tilt axis. Thus, in an embodiment, the sample stage H can be tilted about the X axis, and the Y axis.

The controller is, in an embodiment, able to control the position of the sample S with respect to the optical axis B' in order to reposition the sample S with respect to the optical axis. This may be done by either controlling one or more deflectors 8, or by mechanically moving the sample S with respect to the stationary optical axis B' by controlling the sample holder H accordingly.

According to the method disclosed herein, while acquiring images for the tilt series the orientation of the sample is concurrently changed so that each image is acquired at an associated unique tilt angle and an associated unique orientation. This will be explained later in more detail with reference to FIG. 2 and FIG. 3.

Figure 2:
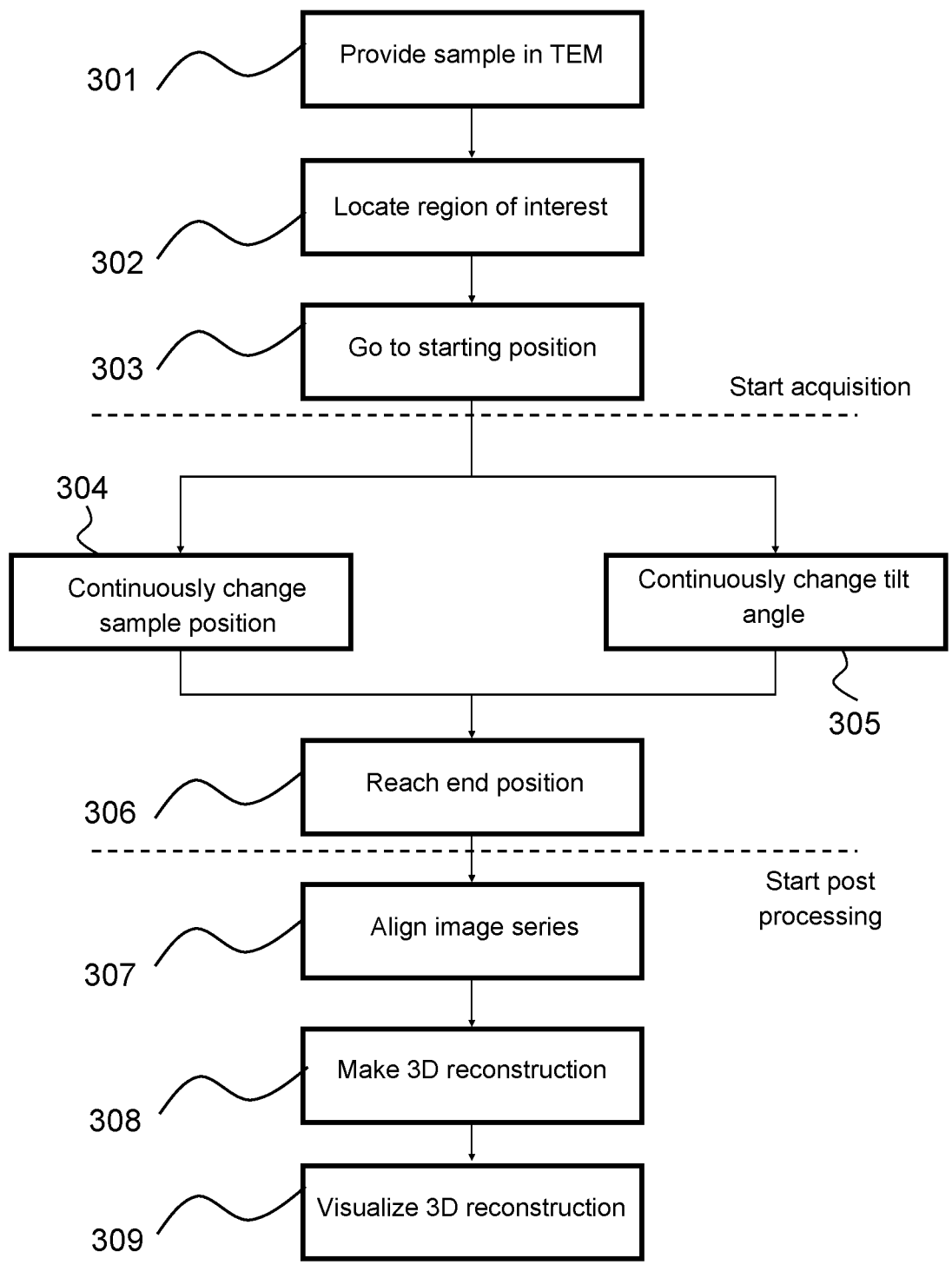
FIG. 2—shows a typical workflow used to make an image of a sample, which may be a tomogram.

FIG. 2 shows a typical workflow used to make an image of a sample with an embodiment of the method as disclosed herein.

In a step 301 a sample is placed in a TEM.

In step 302 the volume-of-interest is located. This may involve the location of markers. The TEM may be optimally focused on the volume of interest. Defocus is set to obtain an optimum between contrast and resolution.

In step 303 the sample is positioned to the starting position, in which a sub-part of the volume-of-interest is imaged. The sample is rotated to its first (extreme) tilt angle of, for example, −70 degrees. The sample is then ready for the tilt series, and the acquisition may be started. Other starting angles, for example zero tilt, are possible as well, of course.

In step 304, the tilt series is started and the tilt is gradually but continuously changed to its other extreme tilt angle, for example +70 degrees. In step 305, while performing step 304, the position of the sample is continuously changed. This way, mutually different sub-parts of the volume-of-interest may be imaged. The imaged part may be kept in (de)focus by (additional) x/y/z translation. Step 304 and 305 may be repeated (as indicated), until the final position is reached in step 306. While changing the position of the sample, it is possible that the tilt is gradually changed back and forth, i.e. from −70 degrees to +70 degrees, and back again to −70 degrees. Thus, a plurality of cycles of tilting may be performed during the concurrent change in position from the starting position to the final position.

In step 307, once all images are acquired, the images forming the tilt series are aligned. It is noted that this may already start while the images are acquired.

In step 308 the tilt series is used for computing a tomogram. It is noted that this step can already start while information is still acquired, thus shortening the total time needed.

In step 309 the tomogram is visualized based on user input (demanded slice plane, angle, thickness, contrast, etc).

As is clear to the skilled person, this is only one of many implementations of the workflow. For example, the workflow can be modified, or other steps can be added.

As an example, it is conceivable that during continuously changing the tilt angle, a sequence of focus settings are concurrently applied. In particular, this means that focus may be continuously changed as well, during continuously changing the tilt angle. Preferably, the speed of change in tilt angle is relatively low compared to the speed of change of the focus setting, such that at a relatively small tilt range, a cycle of focus settings may be applied. Then, at a next relatively small tilt range, a further cycle of focus settings is applied again. By capturing a corresponding sequence of component images at each (relatively small) sample tilt angle range, it is ensured that subsequent images for a given tilt angle range have a plurality of parts of the sample that have a desired given focus state (e.g. in-focus, or a given degree of defocus). It is known to those skilled in the art that in principle, for a tilted sample at a given focus state, only one y-coordinate on the sample will have that state (see coordinates denoted in FIG. 1). Accordingly, in prior-art transmission tomography, a mathematically reconstructed image of a given (subsurface) "layer" or "level" of the sample will typically demonstrate sub-optimal resolution and an erratic power spectrum (basically as a result of processing data with mixed degrees of "blurring"). However, if focus setting is varied whilst continuously tilting the sample, then it is possible to capture a 3D imaging cube that will allow a plurality of y-coordinates on the sample to be reconstructed for a selection of focus states. It is noted that acquiring a sequence of focus settings at a fixed tilt angle, and repeating said sequence for each fixed tilt angle in a range of discrete tilt angle intervals, is known from U.S. Pat. No. 8,912,491 B2 in name of applicant.

In particular, it is conceivable that the position and the tilt angle are interchanged. This means that a starting tilt angle and starting position are selected in step 303, just like before, and that this tilt angle is continuously changed in step 305 until an end tilt angle is reached in step 306. At the same time, the sample position is changed from a starting position to an end position, and then back to the starting position again to do one or more further cycles from the starting position to the end position. Thus, a plurality of cycles of position movement may be performed during the concurrent change in tilt angle, which may be a single cycle from example from −70 degrees to +70 degrees, or a plurality of cycles as well.

FIGS. 3 to 6 give possible embodiments of scan patterns in line with the method as disclosed herein.

Figure 3A:
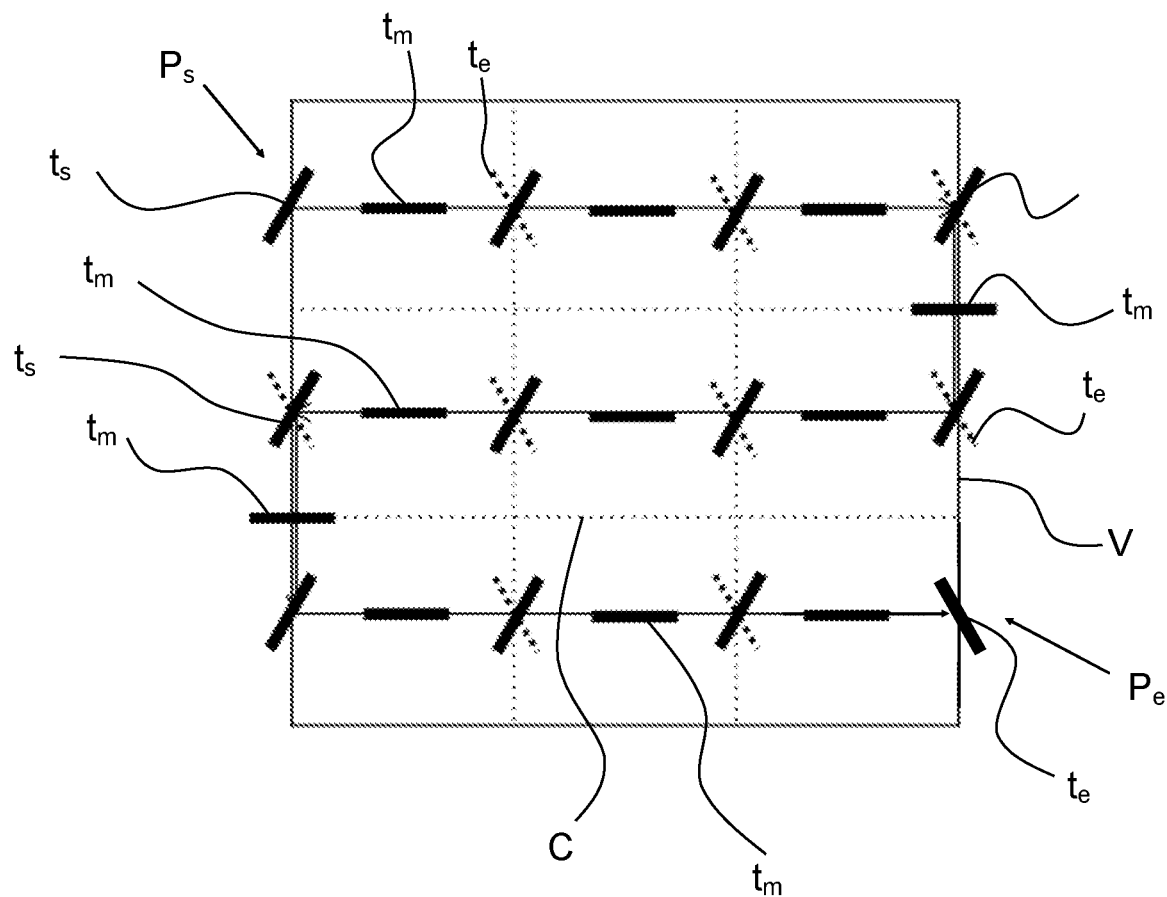
FIG. 3a-b—shows an embodiment of a schematic scanning pattern according to a first aspect of the method as disclosed herein, wherein a tilt angle and a position movement are continuously applied.
Figure 3B:
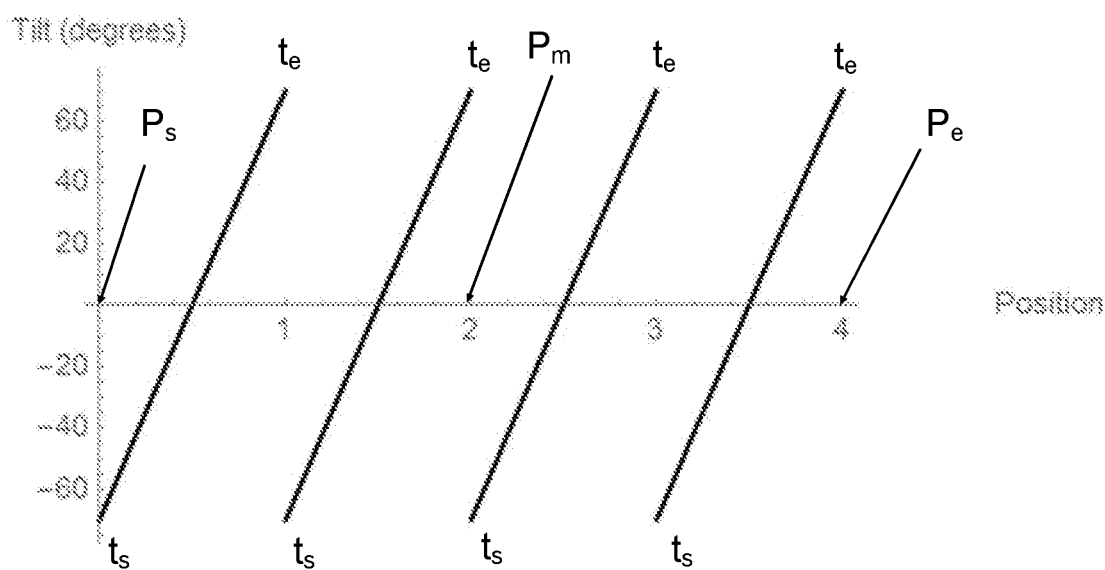

FIG. 3a shows a schematic scan pattern with associated tilt angle and sample position with respect to the electron beam. FIG. 3b shows a diagram of the position (or time) and the tilt angle of the sample holder, corresponding to a part of the scan pattern as shown in FIG. 3a.

In FIG. 3a, V denotes the volume-of-interest of the sample to be imaged. The size of the volume-of-interest V (solid square) is larger than the available field of view C of the camera (dashed lines). Here, the volume-of-interest V is equal to approximately nine times the field of view C. According to prior art methods, each sub-part C is visited once, and a tilt series of images is obtained for the respective sub-part C. Some overlap is needed between sub-parts, to be able to stich subsequent images together.

According to one aspect of the method as disclosed herein, as shown in FIG. 3a, the tilt angle of the sample holder is continuously changed from a starting tilt position $t_s$, to a middle tilt position $t_m$, and to an end tilt position $t_e$. Once the end tilt position $t_e$ is reached, the sample is moved back to the starting tilt angle $t_s$ again. In the embodiment shown (FIG. 3b), tilting back occurs at a very fast speed, but in practice this speed is limited by the possibilities of the stage.

At the same time, while the tilt angle is continuously changed, the position of the sample with respect to the electron beam is also changed, starting at an starting position $P_s$ and moving, with a zig-zag pattern as is shown as an example in FIG. 3a, towards the end position $P_e$. The speed of tilting and relative movement of the sample is chosen here in such a way that all tilt positions are visible in a single sub-part. In practice this means that a specific feature of the sample will enter the image in the left part, for example, at tilt angle $t_s$ and gradually moves through the image with the speed of movement until it exits the image in the right part, for example, at tilt angle $t_e$. It will of course be possible to increase the tilt speed, such that the specific feature is visible in the images, for a number of cycles of tilting.

The effect of the positioning and tilting movement as shown in FIG. 3a and FIG. 3b is that each image is acquired at an associated unique tilt angle and an associated unique position, and that a volume-of-interest V of the sample can be imaged in a fast manner, whilst retaining the detail associated with the specific field of view C.

Figure 4A:
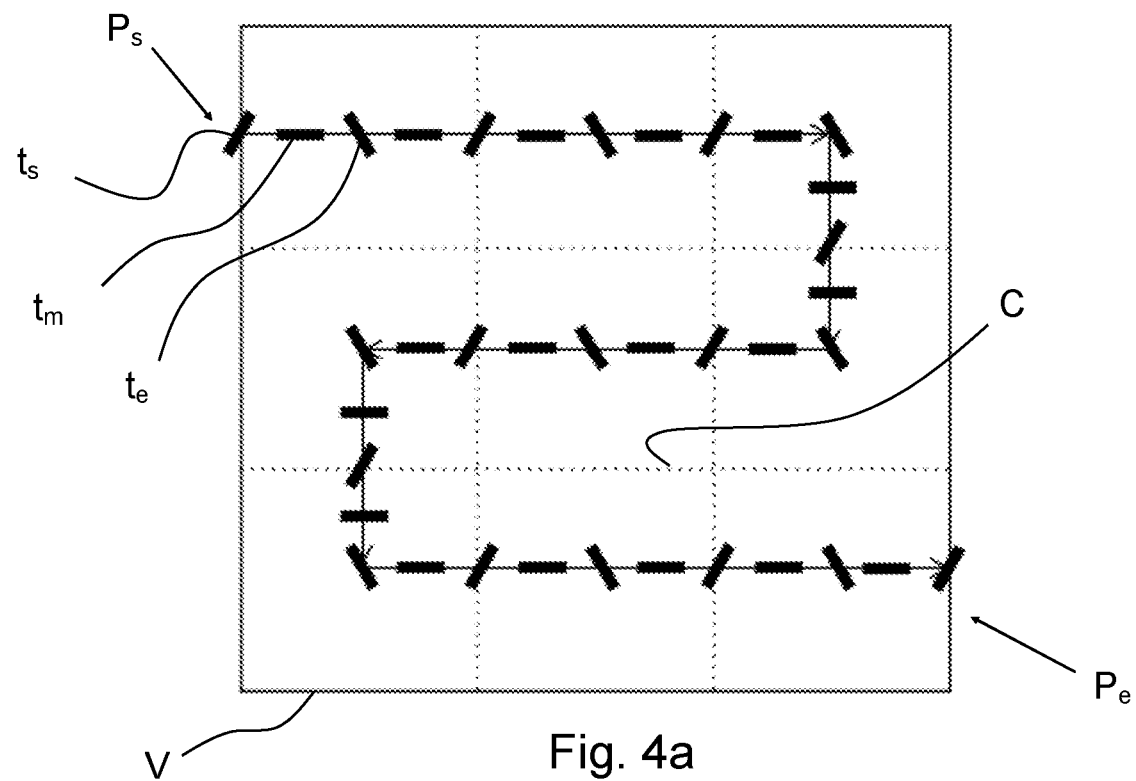
FIG. 4a-4c—show more embodiments of scanning patterns according to the method.
Figure 4B:
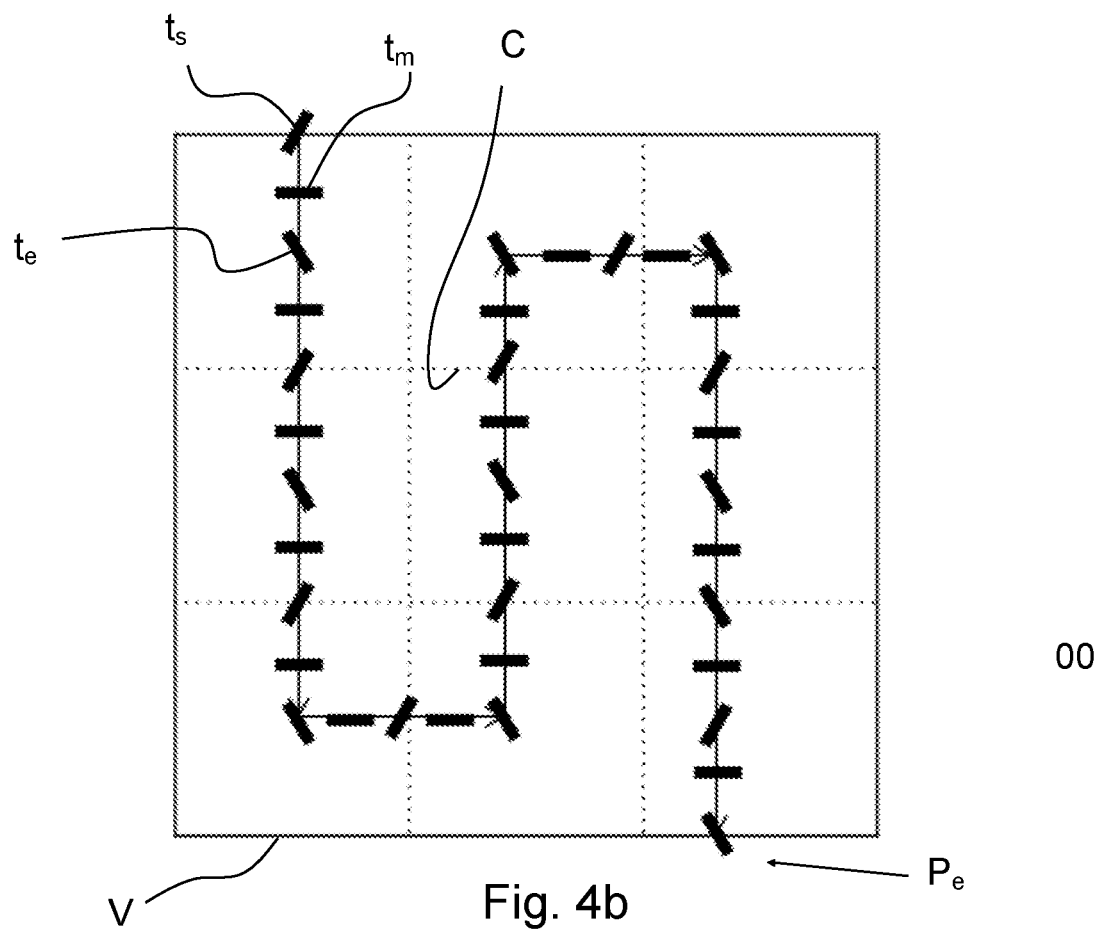
Figure 4C:
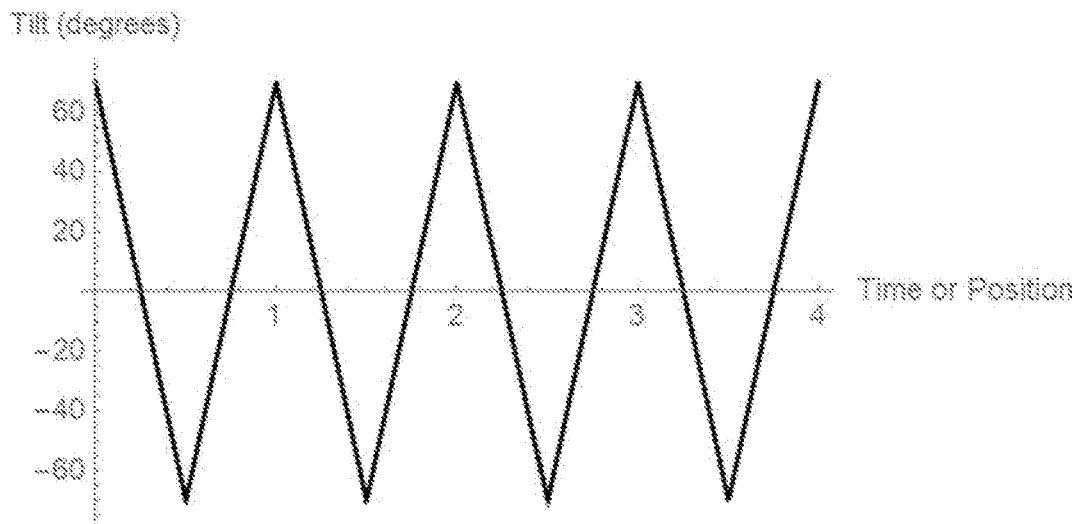

It will of course be clear to those skilled in the art, that the positioning pattern, and the tilting pattern, can be modified as desired. FIG. 4a and FIG. 4b show two embodiments where different movement patterns are used (from starting position $P_s$ to end position $P_e$), and wherein a rocking back-and-forth movement is used for the tilt-angle (see also FIG. 4c, which shows a diagram of time or position versus tilt angle.

Figure 5:
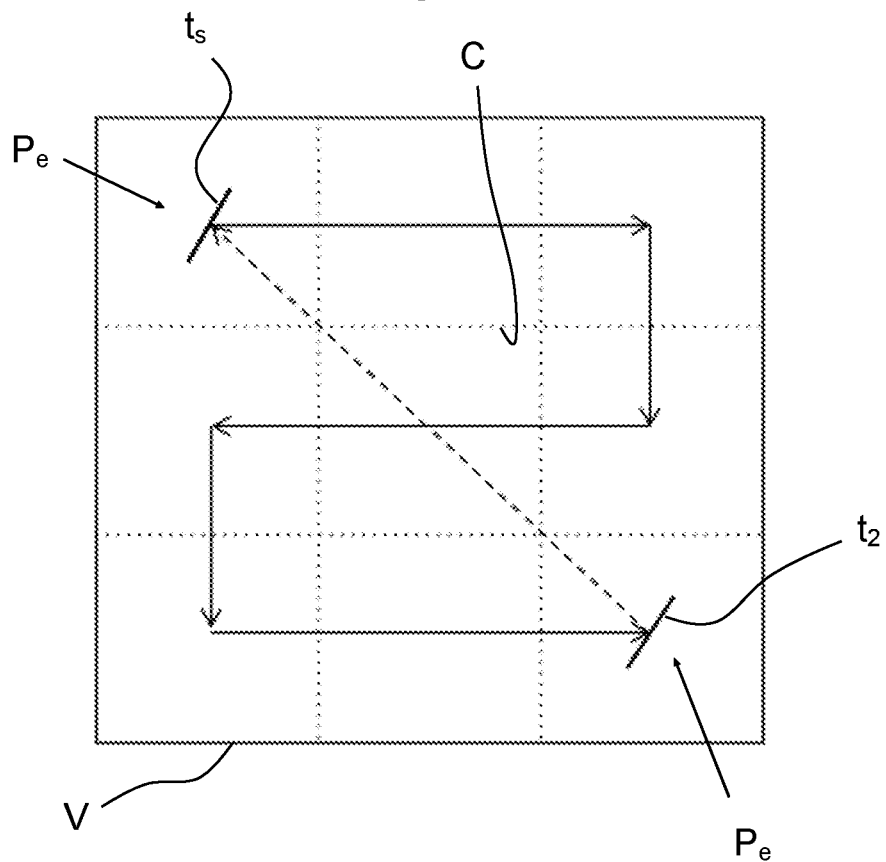
FIG. 5—shows a further scanning pattern according to the method.

FIG. 5 shows an embodiment wherein the positioning movement is relatively fast compared to the tilting speed. Thus, from starting position $P_s$ to ending position $P_e$ the tilt angle is changed from $t_s$ to $t_2$ by an amount of $\Delta\alpha$. Then the sample is repositioned to the starting position $P_s$ again, and another trajectory is made wherein the sample is tilted by an additional amount of $\Delta\alpha$. This process is repeated until the desired tilt range from $t_s$ to $t_e$ is reached, which may be, for example −70 degrees to +70 degrees. Other ranges are of course conceivable as well.

Figure 6:
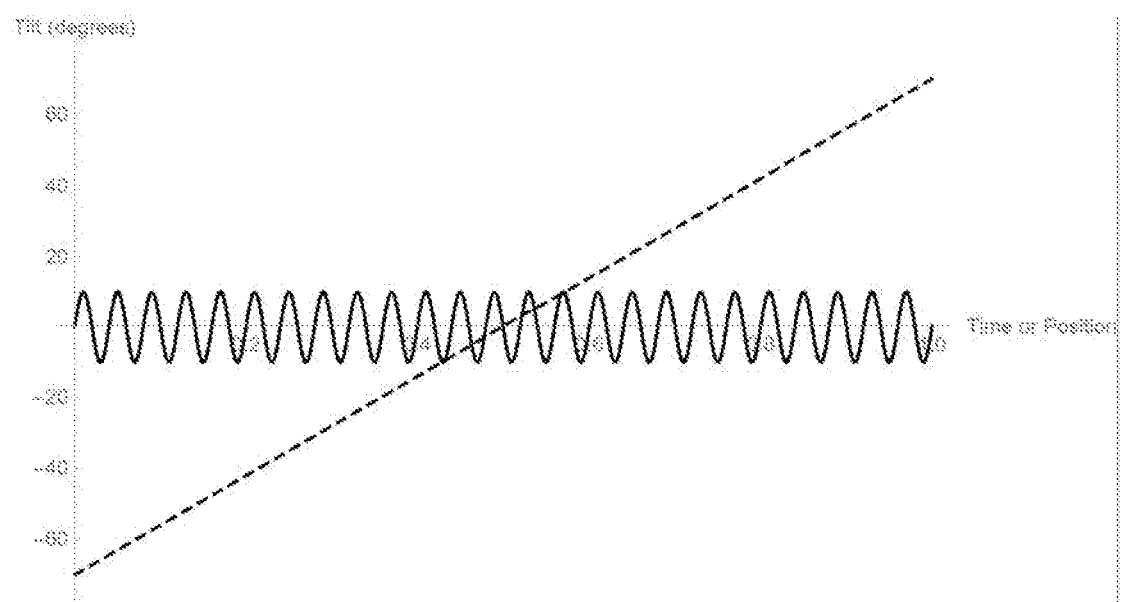
FIG. 6—shows a graph of a further aspect of the method as disclosed herein, wherein a first tilt angle cycle and a further tilt angle cycle are applied.

FIG. 6 shows an embodiment where a first (fixed) tilt angle is continuously changed (dashed line), and at the same time a second (fixed) tilt angle is changed as well (solid line). The second tilt axis may be substantially orthogonal with respect to the first tilt axis. The speed of change may be chosen to be the same for the first and the second tilt angle, but in the embodiment shown the speed of change of the first tilt angle (dashed line) is very low compared to the speed of change for the second tilt angle (solid line). The tilt range may be −70 degrees to +70 degrees for the first tilt angle, and −10 degrees to +10 degrees for the second tilt angle. Other values are conceivable as well. The full range of motion for the second tilt angle may be completed for a relatively small tilt range for the first angle. For example, the change of −10 degrees to +10 degrees of the second tilt angle may be completed whilst the first angle is changed for approximately 5 degrees. Thus, over the given range −70 degrees to +70 degrees, the range in second tilt angle is completed (140 divided by 5 equals) 14 times. In the embodiment shown in FIG. 6, the second tilt angle is completed a total of 25 times for a single cycle of the first tilt angle from −70 degrees to +70 degrees. It will be understood that other values are conceivable as well. It is noted that additionally, a change in position (as discussed with respect to previous FIGS. 3 to 5) may be applied as well. Stages for realizing such a tilting movement are known per se to those skilled in the art.

The desired protection is determined by the appended claims.

The invention claimed is:

1. A method of imaging a sample, said sample mounted on a sample holder in an electron microscope, the electron microscope comprising an electron source for generating a beam of energetic electrons along an optical axis and optical elements for focusing and deflecting the beam so as to irradiate the sample with a beam of electrons, the sample holder capable of positioning and tilting the sample with respect to the electron beam, the method comprising:
acquiring a tilt series of images by irradiating the sample with the beam of electrons, the images recorded on a camera with a read-out speed, wherein the tilt angle is changed continuously while acquiring the tilt series of images; and
concurrently changing a position of the sample whilst acquiring the tilt series so that each image is acquired at an associated unique tilt angle and an associated unique position.

2. The method according to claim 1, wherein changing the position comprises increasing the imaged portion of the sample.

3. The method according to claim 1, wherein changing the position of the sample comprises changing the position of the sample according to a predefined scanning pattern.

4. The method according to claim 1, wherein the position of the sample is changed by means of a relative movement between the sample and the electron beam.

5. The method according to claim 4, wherein the position of the sample is continuously changed by mechanically moving the sample with respect to the electron beam.

6. The method according to claim 1, wherein the sample is imaged on a pixelated camera, and a velocity of the tilt angle, expressed in degrees per second, a velocity of the respective concurrent change in position, expressed in meters per second, and the read-out speed of the camera, expressed in frames per second, are matched so that a displacement of the image due to a tilt change during one frame is less than one pixel.

7. The method according to claim 1, further comprising applying a shift and/or rotational correction of the images forming the tilt series relative to each other.

8. The method of claim 7, wherein the shift and/or rotation correction is based on one or more of the following:
an algorithm using data from more than two images for correction of a relative position of multiple images simultaneously;
a pair-wise correction based on an algorithm using data of two images;
a position of one or more markers in the image.

9. A method of imaging a sample, said sample mounted on a sample holder in an electron microscope, the electron microscope comprising an electron source for generating a beam of energetic electrons along an optical axis and optical elements for focusing and deflecting the beam so as to irradiate the sample with a beam of electrons, the sample holder capable of positioning and tilting the sample with respect to the electron beam, the method comprising:
acquiring a tilt series of images by irradiating the sample with the beam of electrons, the images recorded on a camera with a read-out speed, wherein the tilt angle is changed continuously while acquiring the tilt series of images; and
concurrently changing a further tilt angle of the sample whilst acquiring the tilt series so that each image is acquired at an associated unique tilt angle and an associated unique further tilt angle.

10. The method according to claim 9, wherein said further tilt angle is orthogonal with respect to said tilt angle.

11. The method of claim 10, wherein said tilt angle and said further tilt angle are changed according to predetermined tilt angles.

12. The method according to claim 9, wherein the sample is imaged on a pixelated camera, and a velocity of the tilt angle, expressed in degrees per second, a velocity of the respective concurrent change in further tilt angle, expressed in degrees per second, and the read-out speed of the camera, expressed in frames per second, are matched so that a displacement of the image due to a tilt change during one frame is less than one pixel.

13. The method according to claim 9, wherein use is made of stroboscopic illumination of the sample.

14. The method according to claim 9, further comprising applying a shift and/or rotational correction of the images forming the tilt series relative to each other.

15. The method of claim 14, wherein the shift and/or rotational correction is based on one or more of the following:
an algorithm using data from more than two images for correction of a relative position of multiple images simultaneously;
a pair-wise correction based on an algorithm using data of two images;
a position of one or more markers in the image.

16. An electron microscope equipped for imaging a sample, the electron microscope comprising:
an electron source configured to produce a beam of electrons along an optical axis of the electron microscope;
a sample holder;
a camera system for acquiring images; and
a programmable controller configured to control the sample holder and the camera system, wherein the programmable controller is programmed to control the sample holder and the camera system such that the camera can acquire a tilt series of images of a sample on the sample holder while the sample holder is tilted continuously and the sample position is concurrently changed while acquiring the tilt series so that each image is acquired at an associated unique tilt angle and an associated unique position.

17. The electron microscope according to claim 16, wherein a plurality of cycles of tilting is performed while acquiring the tilt series.

18. An electron microscope equipped for imaging a sample, the electron microscope comprising:
an electron source configured to produce a beam of electrons along an optical axis of the electron microscope;
a sample holder;
a camera system for acquiring images; and
a programmable controller configured to control the sample holder and the camera system, wherein the programmable controller is programmed to control the sample holder and the camera system such that the camera can acquire a tilt series of images of a sample on the sample holder while the sample holder is tilted continuously about a first tilt axis as well as tilted continuously about a second tilt axis, such that each image is acquired at an associated unique tilt angle about the first tilt axis and an associated unique further tilt angle about the second tilt axis.

19. The electron microscope according to claim 18, wherein a plurality of cycles of tilting about the first axis is performed while acquiring the tilt series.

* * * * *